United States Patent
Walther et al.

(10) Patent No.: US 7,062,427 B2
(45) Date of Patent: Jun. 13, 2006

(54) BATCH EDITOR FOR NETLISTS DESCRIBED IN A HARDWARE DESCRIPTION LANGUAGE

(76) Inventors: John Stephen Walther, 1205 W. Knickerbocker Dr., Sunnyvale, CA (US) 94087-1543; Ismed D. S. Hartanto, 25536 Conley Downs Dr., Castro Valley, CA (US) 94552

( * ) Notice: Subject to any disclaimer, the term of this patent is extended or adjusted under 35 U.S.C. 154(b) by 852 days.

(21) Appl. No.: 10/032,789

(22) Filed: Dec. 27, 2001

(65) Prior Publication Data

US 2003/0125925 A1    Jul. 3, 2003

(51) Int. Cl.
*G06F 9/45*    (2006.01)

(52) U.S. Cl. ............... 703/22; 703/14; 716/6; 716/12; 716/1

(58) Field of Classification Search ........... 703/22, 703/14, 13; 716/6, 12, 1, 11, 7, 18, 5; 717/123, 717/143; 382/113; 707/504; 324/530; 712/36
See application file for complete search history.

(56) References Cited

U.S. PATENT DOCUMENTS

| | | | | |
|---|---|---|---|---|
| 5,111,413 | A * | 5/1992 | Lazansky et al. | 703/14 |
| 5,610,832 | A * | 3/1997 | Wikle et al. | 716/11 |
| 5,940,603 | A * | 8/1999 | Huang | 716/5 |
| 6,539,536 | B1 * | 3/2003 | Singh et al. | 716/18 |
| 6,601,024 | B1 * | 7/2003 | Chonnad et al. | 703/14 |
| 6,625,787 | B1 * | 9/2003 | Baxter et al. | 716/6 |
| 6,634,008 | B1 * | 10/2003 | Dole | 716/1 |
| 6,651,235 | B1 * | 11/2003 | Dai et al. | 716/7 |
| 6,836,877 | B1 * | 12/2004 | Dupenloup | 716/18 |
| 2001/0001881 | A1 * | 5/2001 | Mohan et al. | 716/1 |
| 2001/0047509 | A1 * | 11/2001 | Mason et al. | 716/18 |
| 2002/0018583 | A1 * | 2/2002 | Gont et al. | 382/113 |
| 2002/0023107 | A1 * | 2/2002 | Gont et al. | 707/504 |
| 2002/0083398 | A1 * | 6/2002 | Takeyama et al. | 716/1 |
| 2002/0129334 | A1 * | 9/2002 | Dane et al. | 717/123 |
| 2002/0138817 | A1 * | 9/2002 | Lee et al. | 716/12 |
| 2002/0145433 | A1 * | 10/2002 | Morrise et al. | 324/530 |
| 2002/0156609 | A1 * | 10/2002 | Hirata et al. | 703/14 |
| 2002/0183997 | A1 * | 12/2002 | Powell et al. | 703/13 |
| 2003/0033595 | A1 * | 2/2003 | Takagi et al. | 717/143 |
| 2003/0101331 | A1 * | 5/2003 | Boylan et al. | 712/36 |

* cited by examiner

*Primary Examiner*—Paul L. Rodriguez
*Assistant Examiner*—Kandasamy Thangavelu

(57) ABSTRACT

A system and method are disclosed for editing netlists described in a hardware description language (HDL). In one embodiment, a netlist is provided and a changes module is provided. The changes module contains a set of changes associated with the netlist. A tool, such as a netlist compiler, then edits the netlist using the changes described in the changes module. The changes module may be used on subsequent, or different, versions of the netlist where the netlist element changed by the changes module are the same. In this manner, repeated manual editing of a netlist, may be significantly reduced.

19 Claims, 7 Drawing Sheets

Example Changes

```
module new_sub (F, G, H);
        input F, G;
        output H;

AND2 i_and2 (.Q(H), .A(F), .B(G));
endmodule module main+ (N);
        input N;
        wire w2;

new_sub i_new_sub (.H(w2), .F(N), .G(Y[0]));
        OR3 i_or3 + (.B(--w2));

endmodule
```

FIG. 6

Example Modified Netlist

702:
```
module sub (V, W);
    input V;
    output W;

INV i_inv1 (.Q(W), .A(V));

endmodule
```

704:
```
module new_sub (F, G, H);
    input F;
    input G;
    output H;

AND2 i_and2 (.Q(H), .A(F), .B(G));

endmodule
```

706:
```
module main (X, Y, Z, N);
    input X;
    input [1:0]Y;
    output Z;
    input N;          ← 710
    wire w1;
    wire w2;          ← 712 sub i_sub (.V(X), .W(w1));

OR3 i_or3 (.Q(Z), .A(w1), .B(w2), .C(Y[1]));    ← 714 new_sub i_new_sub (.F(N), .G(Y[0]), .H(w2));    ← 716 endmodule
```

BATCH EDITOR FOR NETLISTS DESCRIBED IN A HARDWARE DESCRIPTION LANGUAGE

TECHNICAL FIELD

The present invention relates to electronic design automation (EDA) for designing integrated circuits and, more particularly to a netlist batch editor for editing netlists described in a hardware description language.

BACKGROUND

In the field of electronics, various electronic design automation (EDA) tools are useful in automating the process by which integrated circuits, multi-chip modules, boards, etc., are designed and manufactured. In particular, electronic design automation tools are useful in the design of standard integrated circuits, application specific integrated circuits (e.g., ASICs), and in the design of an integrated circuit that may be programmable.

Verilog and VHDL (VHSIC Hardware Description Language) are conventional hardware description languages and are widely used to describe an integrated circuit design. VHDL, for example, is a hardware description language (HDL) used to design integrated circuits at the component, board, and system levels. VHDL allows models to be developed at a high level of abstraction. Similarly, Verilog is a hardware description language (HDL) used to design electronic systems at the component, board and system levels.

In designing an integrated circuit, an integrated circuit designer typically creates a netlist description of an integrated circuit. The netlist may be in the form of a hardware description language, such as Verilog, VHDL, or other suitable hardware description language.

A netlist generally describes the integrated circuit design and is typically stored in computer readable media and processed using well-known techniques. The netlist may include a list of logic gates and their interconnections, which make up the integrated circuit. One use of the netlist is the creation of a physical device layout in mask form, which can be used to directly implement structures in silicon to realize the physical integrated circuit.

During conventional development of an integrated circuit, however, there are many instances in which significant manual editing of the hardware description language netlist is necessary. These manual edits are typically cumbersome and may be error-prone and time-consuming.

For example, during development of an integrated circuit, it is common to make changes to a netlist in order to add test circuits for testing the associated integrated circuit described by the netlist. Later in the development process, it may be desirable to apply the same changes to a revised netlist, which may be an altered, or updated, version of the netlist. According to conventional approaches, in this situation, the revised netlist is manually edited to include the same changes originally made to the netlist. This manual editing of the revised netlist may be cumbersome, error-prone, and time-consuming.

Manual editing a netlist to include the same changes made to another netlist is, therefore, undesirable in that it may consume valuable development resources.

SUMMARY

A need exists, therefore, for a system and method by which a hardware description language netlist may be edited in a more automated fashion in order to reduce, or eliminate, the need to manually make changes to the netlist.

According to one aspect of the present invention, the present system and method provide a batch editor for automatically editing a netlist with a set of changes, or modifications, to the netlist. The changes to the netlist may include, but are not limited to, the addition of a module or a module instance, a change in the connection between netlist elements, a change in an attribute of a netlist element, addition of ports on a wire, or the like.

A netlist including a set of netlist modules is provided. A changes module, separate from the netlist modules, is also provided. The changes module describes one or more changes to the netlist modules. A batch editor software tool then uses the changes module to modify at least one of the netlist modules by making the changes described in the changes module to the at least one of the netlist modules to create a modified netlist. The modified netlist comprises an edited version of the netlist, modified to contain at least one change described in the changes module.

Pursuant to another aspect of the present invention, the set of netlist modules, changes module, and the modified netlist comprise the syntax of a hardware description language, such as Verilog, VHDL, or other suitable hardware description language.

Another aspect of the present invention includes a changes module written in an "extended" or modified version of conventional hardware description language syntax. In particular, the changes module may include conventional hardware description language syntax and one or more modifiers. The modifiers are used to indicate a change to an associated portion of the netlist.

According to another aspect of the present invention, a novel netlist compiler is provided and serves as a batch editor for the netlist. The netlist compiler recognizes the modifiers, such as definitional, instance, attribute, or port modifiers, in the changes module as indicating changes to the netlist. Upon recognizing a modifier within the changes module, the netlist compiler calls up an associated semantic routine, which changes the netlist in accordance with the changes associated with the modifier. In one embodiment, the netlist compiler makes the changes to the netlist after converting the netlist into a representational object-based version of the netlist. The netlist compiler may output the modified netlist using an HDL language format.

Accordingly, a system and method are provided for automatically applying a set of changes to a netlist. In particular, a set of changes is described in a changes module using a conventional HDL with the addition of one or more modifiers. The netlist compiler then makes the changes described in the changes module to the netlist. The changes described in the changes module may be later applied to different versions of the netlist to avoid the need to manually edit the different version to include the same changes as those described in the changes module, thereby conserving valuable development time and resources. In addition, automatically applying edits in this fashion may be less error-prone than conventional methods of manually editing netlists.

The present invention is best understood by reference to the following detailed description when read in conjunction with the accompanying drawings.

BRIEF DESCRIPTION OF THE DRAWINGS

FIG. 6 illustrates an example set of changes associated with the netlist of FIG. 5.

FIG. 7 illustrates an example modified netlist comprising the netlist of FIG. 5 as modified by the set of changes of FIG. 6.

Common reference numerals are used throughout the drawings and detailed description to indicate like elements.

DETAILED DESCRIPTION

Environment

Figure 1:
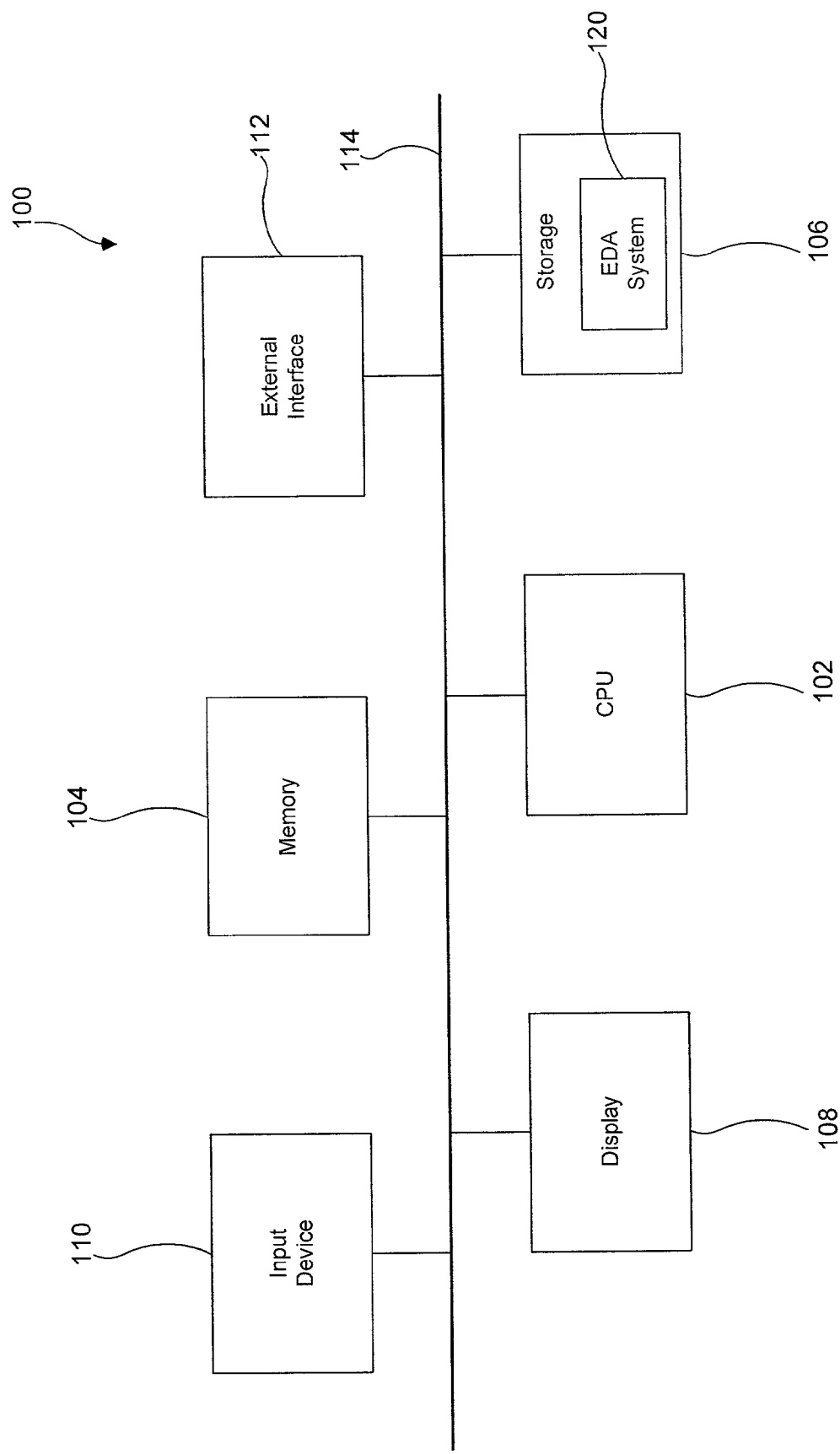
FIG. 1 is a block diagram of a computer system including an EDA system in accordance with one embodiment of the present invention.

FIG. 1 illustrates an exemplary general purpose computer system 100 suitable for use in implementing the present system and method. The computer system 100 includes a central processing unit (CPU) 102 for processing information and instructions, a memory 104 that may include a volatile memory, a non-volatile memory, or both (e.g., random access memory RAM, and read only memory ROM) for storing information and instructions for the central processing unit 102. The computer system 100 also includes a data storage device 106, such as a magnetic or optical disk and disk drive, for storing information and instructions. A display device 108, such as a CRT, liquid crystal device, or the like, is included within the computer system 100 for displaying information to a user thereof.

Also included in computer system 100 is input device 110. The input device 110 may comprise an alphanumeric input device (e.g., a keyboard) including alphanumeric and function keys, a cursor control or directing device (e.g., a mouse), or both, for communicating user input information and command selections to the central processing unit 102. The computer system 100 may also include an external interface 112, such as a network interface card, modem, or the like for exchanging data with other devices (not shown), such as a networked computer system (not shown). The central processing unit 102, the memory 104, the data storage device 106, the display 108, the input device 110, and the external interface 112 are coupled together by at least one bus 114.

The computer system 100 is merely illustrative and the present system and method may be readily employed on any one of a variety of personal computers, workstations, in any one of a variety of programming languages (e.g., C++), and using any of a variety of operating systems (e.g., UNIX).

An EDA system 120, in accordance with one embodiment of the present invention, is stored in the data storage device 120 and may be loaded into memory 104 for execution. Details of the EDA system 120 are described below.

EDA System

Figure 2:
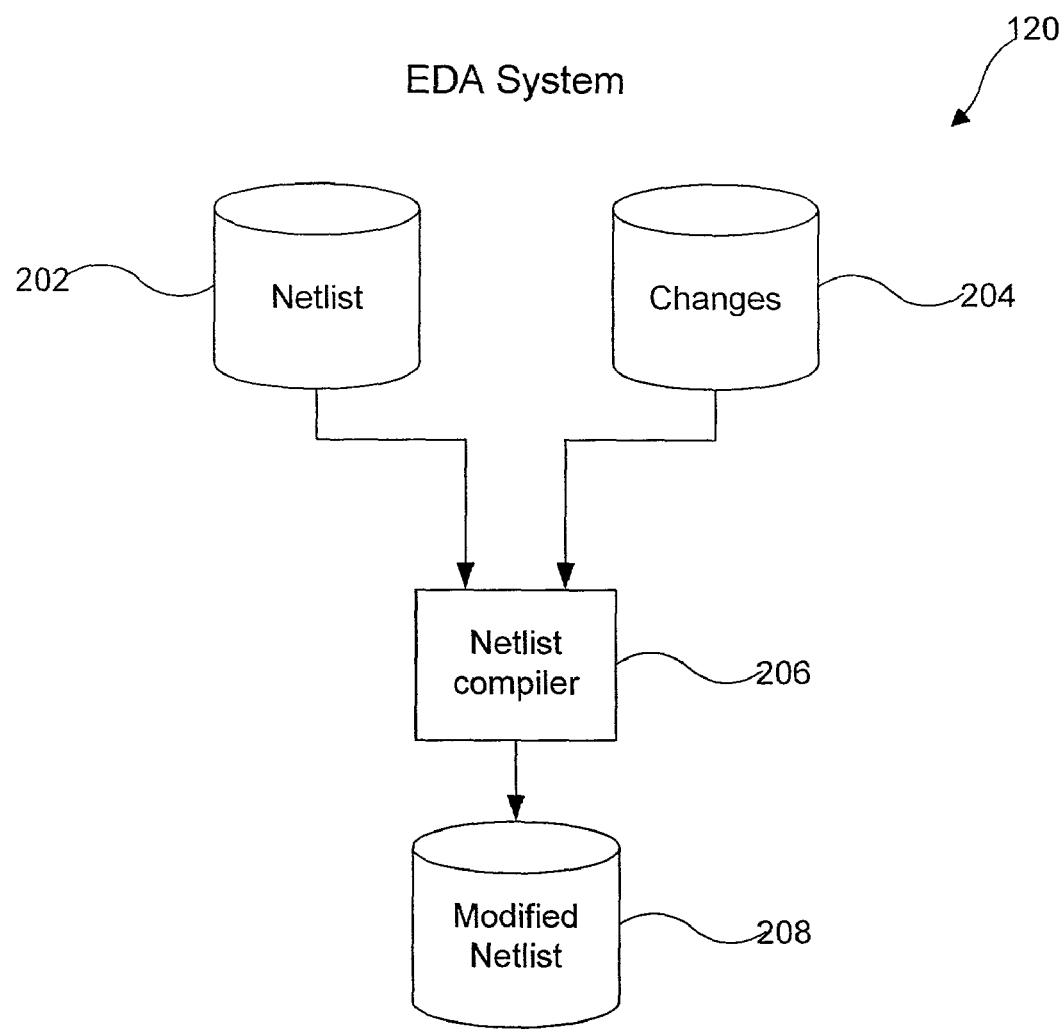
FIG. 2 is a block diagram illustrating details of one embodiment of the EDA system of FIG. 1 according to the present invention.

FIG. 2 illustrates details of the EDA system 120. As shown, the EDA system 120 includes a netlist 202, a changes module 204 associated with the netlist 202, a netlist compiler 206, and a modified netlist 208.

Figure 5:
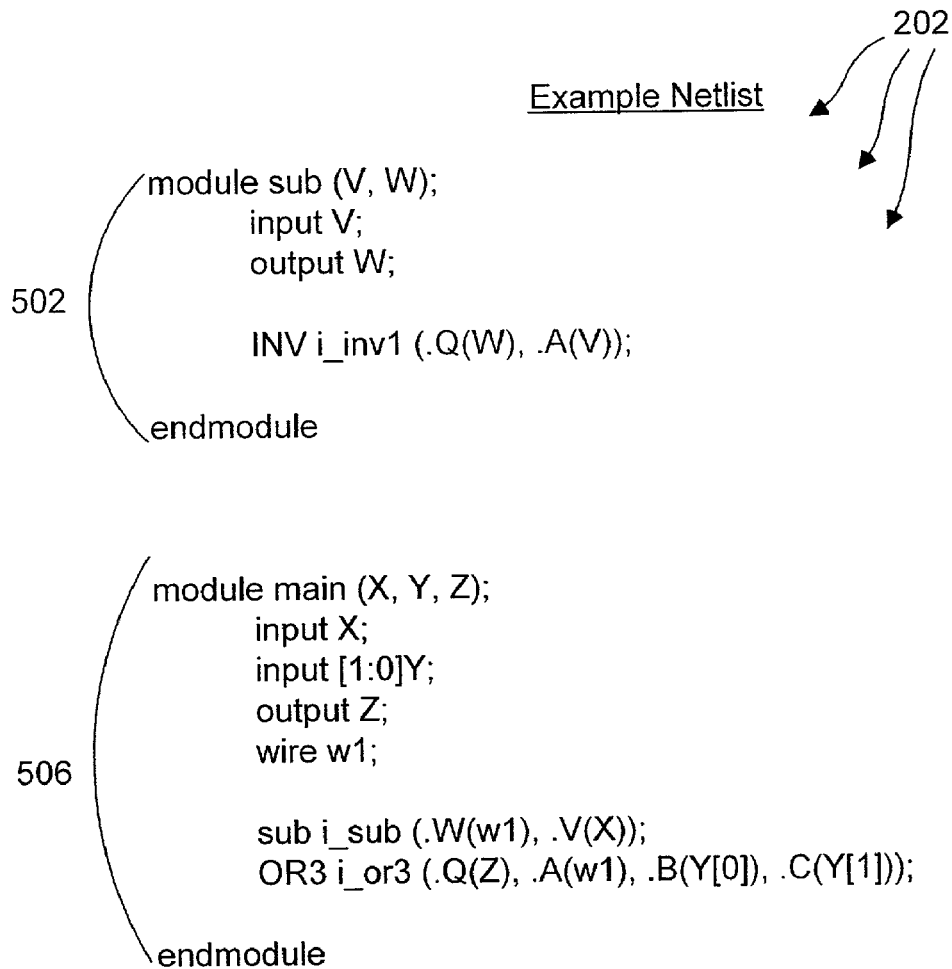
FIG. 5 illustrates an example embodiment of the FIG. 2 netlist.

The netlist 202 is a description of an integrated circuit and may be written in Verilog, VHDL, or any other suitable hardware description language. An example netlist 202 is shown in FIG. 5 and is discussed below. Of course, the contents of the netlist 202 may vary depending on the integrated circuit design.

The changes module 204 contains a set of changes associated with the netlist 202. The changes module 204 may comprise a separate file, as shown in FIG. 2. Optionally, the changes module 204 may be concatenated with the netlist 202 in a single file (not shown) comprising the netlist 202 and the changes module 204.

The changes module 204 may include an HDL description of one or more changes associated with the netlist 202 using HDL syntax and additional modifier characters. In one embodiment, the changes module 204 is written in the same HDL language as the HDL language in which the netlist 202 is written, with some extensions to the HDL language. That is, where the netlist 202 is written in Verilog HDL, the changes module 204 may be written in an "extended version" of Verilog HDL, which includes the Verilog HDL syntax and some extensions, such as modifier characters.

For example, one extension that may be used with the Verilog HDL is a definitional modifier. In one embodiment, a definitional modifier may comprise a suffix having one or more characters appended to a module name in a line of a module and indicates that the module contains a change in the module definition or a change in an instantiation of the module in the netlist 202 that bears an identical name. In one embodiment, a definitional modifier is a "+" character that follows the name of the module of the netlist 202 to be changed. That is, if a module to be changed in the netlist 202 was named module "numbergen", then the changes module will include a module named "numbergen+" to identify the module of the netlist 202 that is to be modified, or changed. The "+" character may not be a normal constraint of the HDL language in which the netlist 202 is written.

As another example, an extension that may be used with the Verilog HDL includes the use of an instance modifier, which represents a change in the connection of a particular port of a module instance. An instance modifier may comprise a prefix having one or more characters that precedes a name of a replacement port. In one embodiment, an instance modifier is the character string "--" and may be used as a prefix to a replacement port name. The instance modifier with no replacement port name immediately thereafter may also represent the change of disconnecting a previously connected port of a module instance.

As yet another example, an extension that may be used with the Verilog HDL includes the use of an attribute modifier, which permits any of a potentially wide variety of attributes to be associated with a module or an instance. The attribute modifier may include an attribute name and an attribute value. For example, an instance could read as follows: AND comp_1+(uninstantiate="true");. In this instance, the attribute name is "uninstantiate" and the attribute value is "true". The uninstantiate name causes the associated instance (i.e., AND comp_1) to be uninstantiated, or removed, from the associated module when the associated attribute value is "true". As another example, an instance could read as follows: AND comp_1+ (replace_module_with="NAND"). Here, the attribute name is "replace_module_with" and the attribute value is "NAND". The "replace_module_with" name causes the module associated with the module instance comp_1 (i.e., AND) to be replaced with a module called "NAND". Of course, attribute modifiers may be used to change any of a variety of attributes of netlist elements.

Another set of extensions relates to the description of wires in an HDL netlist. In conventional Verilog, a wire may be described by use of a wire statement, which includes the Verilog keyword "wire" followed by a name associated with the wire. According to an embodiment of the present invention, the addition of one or more ports to a wire statement may be described in the changes module 204. For example, the modification of the ports on a wire "ABC" may be accomplished using the following statement: wire ABC (AND_1*Q, --OR_5*A);. This statement adds port "Q" (using the port modifier "*") of the AND_1 gate (and also any ports connected to port Q) to the wire ABC and the statement also replaces any previously-established wire connected to port "A" of the OR-5 gate with the wire ABC. The ports added to a wire as described herein may be of the same or different hierarchical levels. That is, one port of a wire may be at one hierarchical level of the integrated circuit design and another port of the same wire may be at a different hierarchical level. In one embodiment, a wire port may be at the same hierarchical level or at a lower hierarchical level as the other port or ports of the wire. A lower hierarchical level refers to being within a sub-module contained within another module, which is at a higher hierarchical level.

Accordingly, the changes module 204 may include definitional modifiers, instance modifiers, attribute modifiers, port modifiers, other modifiers, or a combination of these modifiers.

In one embodiment, the netlist compiler 206, which functions as a netlist batch editor, receives the netlist 202 and the changes module 204 and makes the changes specified in the changes module 204 to the netlist 202 and outputs a modified netlist 208. The modified netlist 208 comprises the netlist 202 with the changes described in the changes module 204 incorporated therein. The modified netlist 208 may be in a hardware description language (HDL), such as Verilog or VHDL, or other suitable format.

Accordingly, a user initially describes a set of changes associated with the netlist 202 in the changes module 204. The netlist compiler 206 then makes the changes described in the changes module 204 to the netlist 202 to create a modified netlist 208. A netlist compiler 206 may subsequently apply the changes described in the changes module 204 to other versions (not shown) of the netlist 202, where there is no change to the portion of the netlist 202 that is modified by the changes described in the changes module 204.

Hence, rather than requiring manual editing a subsequent version of a netlist 202, the netlist compiler 206 automatically edits the subsequent version of the netlist 202 with the changes contained in the changes module 204. This automatic editing saves significant development time and resources as well as reducing, or eliminating, the introduction of errors during the manual editing of the subsequent netlist 202.

Figure 3:
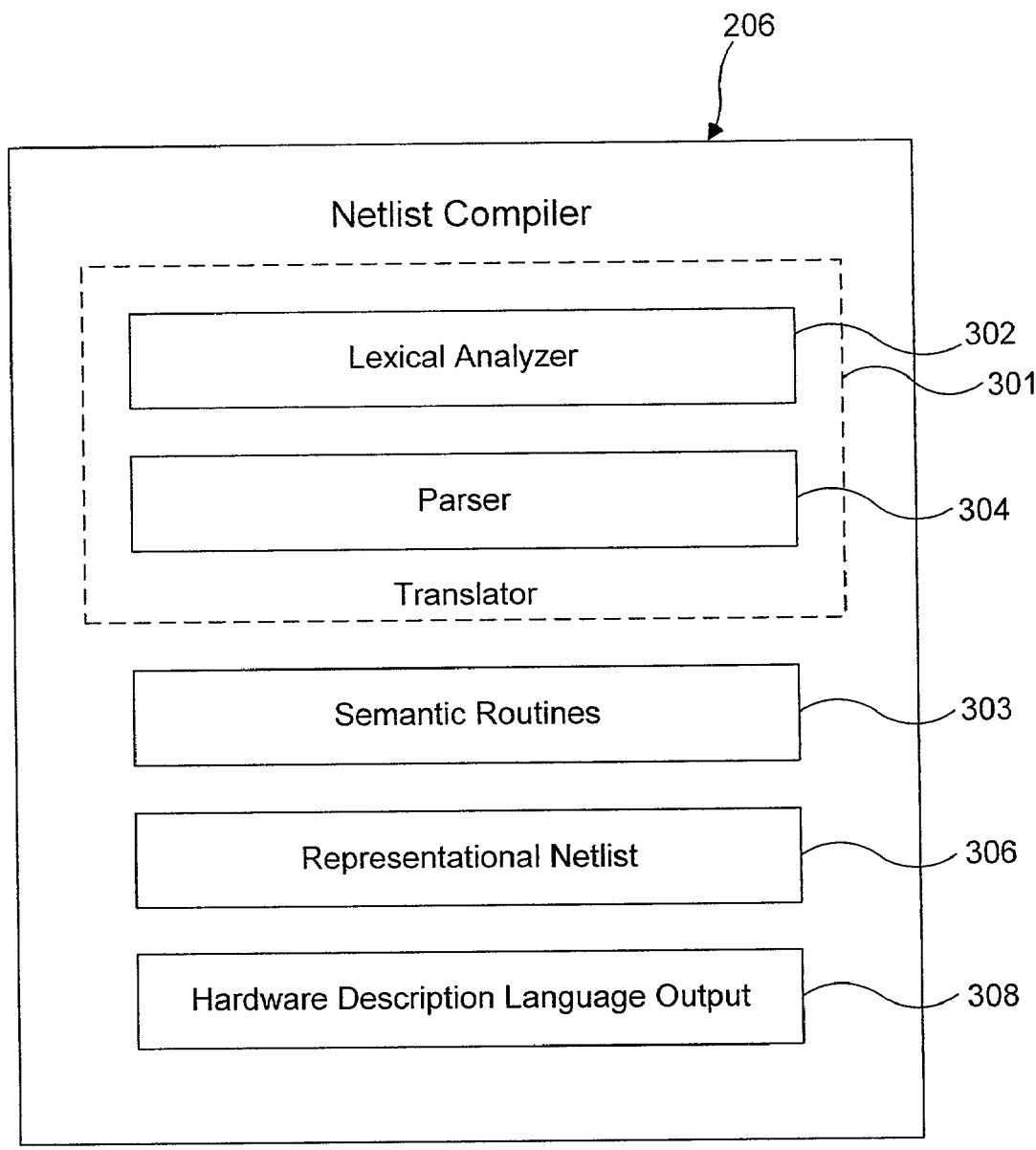
FIG. 3 is a block diagram illustrating details of the netlist compiler of FIG. 2 in accordance with one embodiment of the present invention.

FIG. 3 illustrates details of one embodiment of the netlist compiler 206. As shown, the netlist compiler 206 comprises a translator 301 having a lexical analyzer 302 and a parser 304. The netlist compiler 206 also includes semantic routines 303, a representational netlist 306, and a hardware description language output 308.

The lexical analyzer 302 is a component of the netlist compiler 206 that reads the netlist 202 and the changes module 204 and produces, as an output, a set of tokens (not shown) that the parser 304 uses for syntax analysis. In general, lexical analysis involves breaking the HDL text into distinct, non-overlapping text strings in accordance with the rules of a specified language, such as Verilog or VHDL. These non-overlapping text strings are commonly referred to as "tokens." The lexical analyzer 302 may characterize some of these text strings where the text matches a keyword, or is a number or a symbol such as "&". In one embodiment, the lexical analyzer 302 comprises a conventional lexical analyzer, modified to recognize one or more of the HDL extensions found in the changes module 204 (FIG. 2) and described above.

After the lexical analyzer 302 breaks the text into tokens, the parser 304 converts the entire sequence of tokens into the representational netlist 306 that describes the integrated circuit design. The parser 304 recognizes the definitional, instance, attribute, and port modifiers as represented in the tokens and calls up associated semantic routines 303 that make the changes to the representational netlist 306 that are associated with such modifiers. The representational netlist 306 may comprise an object-based netlist.

Additional background details regarding the nature and mathematical structure of compilers are described in Compiler Principles, Techniques and Tools, by Alfred Aho, Ravi Sethi, and Jeffrey Ullman, 1986, ISBN 0-201-10088-6 which is hereby incorporated by reference. Background steps for building a compiler are described in Introduction to Compiler Construction with UNIX by Axel T. Schreiner and H. George Friedman, Jr., published by Prentice-Hall, 1985, ISBN 0-13-474396-2, which is hereby incorporated by reference.

The semantic routines 303 are called up by the parser 304 and modify the netlist 202 (FIG. 2), as represented in the representational netlist 306, according to the changes module 204 (FIG. 2). At least one of the semantic routines 303 is associated with at least one of the modifiers (e.g., definitional, instance, attribute, and port modifiers) and makes one or more changes to the netlist 202 as represented in the representational netlist 306. The parser 304 identifies, or selects, and calls up a semantic routine 303 depending on the modifier type, (e.g., definitional, instance, attribute, and port). The selected semantic routine 303 then makes one or more changes to the netlist 202 as represented in the representational netlist 306 according to the syntax associated with the modifier. The changed, or modified, version of the netlist 202 is stored as the representational netlist 306.

The hardware description language output 308 converts, or translates, the representational netlist 306 into a hardware description language, such as Verilog, VHDL, or the like.

Figure 4:
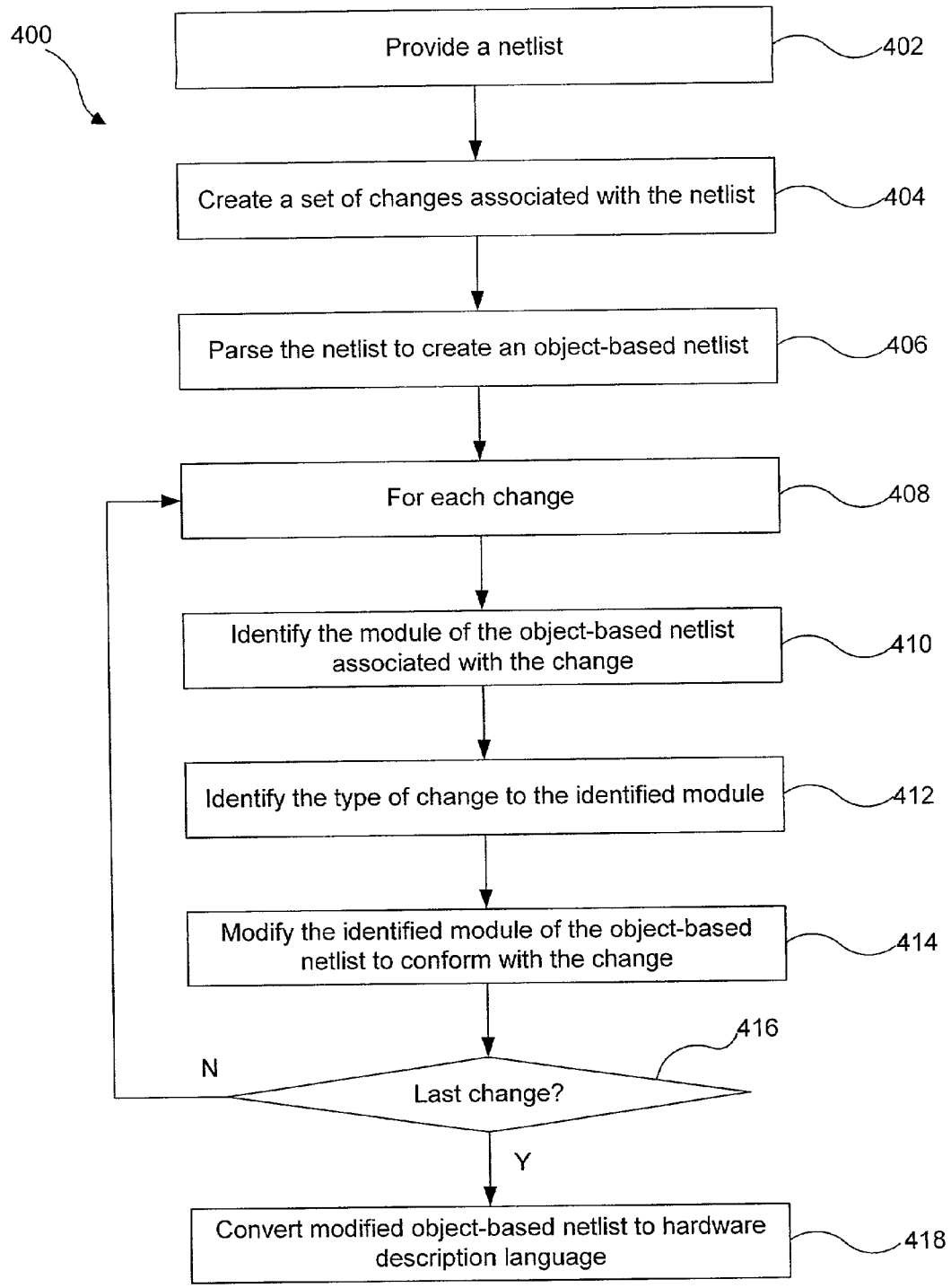
FIG. 4 is a flowchart illustrating a method in accordance with one embodiment of the present invention.

FIG. 4 is a flowchart 400 illustrating one embodiment of a method according one embodiment of the present invention. The flowchart 400 commences in block 402 with the provision of a netlist 202 (FIG. 2). As described above, the netlist 202 may comprise an HDL description of an integrated circuit design. An example netlist 202 is shown in FIG. 5 and described below.

Next, pursuant to block 404, a set of changes, such as the changes module 204 (FIG. 2), is created. As described above, the changes module 204 includes modifiers, such as definitional, instance, attribute, and port modifiers. These modifiers are useful in permitting the netlist compiler 206 (FIG. 2) to identify changes in the changes module, determine the type of change, and effect the changes. An example changes module 204 is shown in FIG. 6 and described below.

As shown in FIG. 3, the netlist compiler 206 receives both the netlist 202 and the changes module 204. Referring to FIG. 4, the netlist compiler 206, using the translator 301 (FIG. 3), then parses the netlist 202 to create a representational netlist 306, pursuant to block 406. The representational netlist 306 may be manipulated more efficiently than a HDL format netlist in some applications.

Of course, the present system and method may be accomplished without converting the netlist 202 into the representational netlist 306. Indeed, according to one embodiment, the HDL format netlist 202 (FIG. 2) may be manipulated directly, without converting the netlist 202 to an object based netlist.

Next, pursuant to block 408, the netlist compiler 206 identifies a change in the changes module 204 (FIG. 2). In particular, each change in the changes module 204 is associated with at least one of the modifiers. Hence, the netlist compiler 206 identifies the presence of a change in the changes module by identifying one of the modifiers. In one embodiment, the parser 304 identifies changes in the changes module 204 by identifying one of the modifiers.

At block 410, the netlist compiler 206 (FIG. 2) identifies the module, or modules, associated with a change. The parser 304 of the netlist compiler 206 may perform this function. A module is the basic unit in the Verilog HDL and generally represents a logical entity that can be implemented in hardware. Hence, the netlist compiler 206 identifies the module, or modules, to be changed using the syntax of the line in which the modifier appears.

At block 412, the netlist compiler 206 identifies the type of change to the identified module. In one embodiment, the parser 304 identifies the type of change to the identified module according to the characters that comprise the modifier. For example, in one embodiment, if the modifier comprises a "+" character as a suffix on a module name or instance name, then the parser 304 associates the change with a change in the module definition or an instantiation of a module, respectively. Next, at block 414, the netlist compiler 206 modifies the identified module to conform with the identified change. In one embodiment, the parser 304 of the netlist compiler 206 identifies, selects, and calls up the semantic routine 303 that is associated with the type of change identified in block 412. The identified semantic routine 303, in turn, makes the changes specified in the line of the identified module that contains the modifier according to the syntax of that line.

In block 416, the netlist compiler 206 (FIG. 2) determines whether the identified change is the last change in the changes module 204. In one embodiment, the parser 304 (FIG. 3) of the netlist compiler 206 determines whether there are any more modifiers for which the associated changes have not been made. If the identified change is not the last change in the changes module 204, then execution returns to block 408. Else, if the identified change is the last change in the changes module 204, then execution proceeds to block 418.

At block 418, the hardware description language output 308 converts, or translates, the representational netlist 306, which may comprise an object-based netlist, to a hardware description language format. For example, the hardware description language output 308 may convert the representational netlist 306 into Verilog, VHDL, or other suitable HDL. FIG. 7 illustrates an example modified netlist 208.

As described above, the flowchart 400 describes one embodiment of a method according to the present invention. In another embodiment, the netlist compiler 206 implements the changes specified in the changes module 204 to the netlist 202 without converting the changes module 204 or the netlist 202 from a hardware description language. Pursuant to this alternative embodiment, the netlist compiler 202 comprises a batch editor software tool that copies modules of the netlist 202 to a working netlist. Then, for each change specified in the changes module 204, the batch editor calls up and causes to be executed a semantic routine that implements the changes specified in the changes module 204 to the working netlist. This process continues until the batch editor has implemented all of the changes specified in the changes module 204. The resultant working netlist then comprises the modified netlist 208 that describes the netlist 202 as modified by the changes described in the changes module 204. In one embodiment, the representational netlist 306 may be used directly in further processing to, for example, generate test patterns or perform fault simulation without having to first output the netlist in HDL form.

Further, by using the modifiers described above as extensions to a conventional HDL, such as Verilog or VHDL, changes to a netlist may be efficiently described and edited, or incorporated into, a netlist.

FIGS. 5, 6, and 7 illustrate an example of the operation of one embodiment of the present system and method.

FIG. 5 illustrates one example embodiment of the netlist 202 described in Verilog HDL. As shown, in this embodiment, the netlist 202 comprises module sub 502 and module main 506. The Verilog syntax used to describe the netlist 202 of FIG. 5 is well known to those skilled in the art and, accordingly, no further description of this embodiment of the netlist 202 is necessary. The example netlist 202 of FIG. 5 could alternatively be written in VHDL or other suitable hardware description language. Moreover, the example netlist 202 is a relatively short netlist compared to the many common HDL netlists that include hundreds or thousands of modules.

FIG. 6 illustrates one example embodiment of the changes module 204 and comprises lines 602 through 616 as well as module new_sub 504. The changes module 204 of FIG. 6 describes the following three changes associated with the netlist 202 of FIG. 5: (1) add a new input 'N' to the module 'main' (see lines 602, 604), (2) instantiate a new module 'new_sub i_new_sub' in the module 'main' (see line 610), and (3) change the connection of the instantiated module 'OR3 I_or3' such that the pin 'B' input which was previously connected to the input pin Y[0], is now connected to the wire 'w2' (see lines 606, 612). Lines 608 and 614 are blank, and are, therefore, generally ignored by the netlist compiler 206 (FIG. 2).

Line 602 of the changes module 204 of FIG. 6 commences with the Verilog keyword "module", which is followed by the module name "main", which has the suffix "+" appended thereto. The suffix "+" is a definitional modifier and indicates to the netlist compiler 206 (FIG. 2) that the lines that follow include a change in the module definition or an instantiation of the module "main." The phrase "(N)" in line 602 specifies a new port "N" of module "main".

Line 604 specifies that the new port "N" to the module "main" is an input.

Line 606 specifies the name of a new wire "w2".

Line 610 instantiates a new module "new_sub" in the module "main" and is written in Verilog syntax.

Line 612 changes the connection of the instantiated module "OR3" such that the pin "B" input which was previously connected to the input pin Y[0], is now connected to the wire "w2". Specifically, line 612 includes the instance modifier "--", which is a prefix appended to the wire name "w2" and represents a change in the connection of a particular port of an instance. In this example, the instance modifier "--" of line 612 precedes "w2" in the statement (.B(--w2)), indicating that the "B" input is to be disconnected from its previous connection (i.e., the input pin Y[0], see module 506 of FIG. 5) and connected to the wire "w2".

The changes module 204 ends at line 616 with the "endmodule" keyword, indicating the end of the module 204.

FIG. 7 illustrates an example embodiment of the modified netlist 208 (FIG. 2). The modified netlist 208 shown in FIG. 7 comprises the netlist 202 of FIG. 5 as modified by the netlist compiler 206 (FIG. 2) using the changes module 204 of FIG. 6.

As shown, the modified netlist 208 includes modules 702, 704, and 706. The modules 702 and 704 are equivalent to the modules 502 and 504, respectively, of the FIG. 5 netlist 202.

Module 706 of the modified netlist 208 of FIG. 7 differs, however, from the netlist 202 and includes the changes described in the changes module 204 of FIG. 6. In particular, line 710 specifies an input "N" to the module "main", line 712 specifies the name of new wire "w2", line 716 instantiates a new module "new sub" in the module 706, and line 714 recites a changed connection of the "B" input from "Y[0]" to the wire "w2". The modified netlist 208 is shown as being written in Verilog language syntax, although the format of the modified netlist can vary. Accordingly, the modified netlist 208 comprises the netlist 202 with the changes described in the changes module 204 made therein.

This disclosure provides exemplary embodiments of the present invention. The scope of the present invention is not limited by these exemplary embodiments. Numerous variations, whether explicitly provided for by the specification or implied by the specification, may be implemented by one of skill in the art in view of this disclosure.

What is claimed is:

1. A method for editing a netlist, the method comprising:
providing a version of the netlist comprising a set of hardware description language netlist modules;
creating a changes module in hardware description language describing at least one consistent change to the netlist modules, the at least one consistent change being applicable to multiple versions of the netlist;
using the changes module to modify at least one of the netlist modules according to the at least one consistent change to create a modified version of the netlist.

2. The method of claim 1, wherein the changes module contains a modifier associated with at least one of the netlist modules, the modifier indicating a change in the associated netlist module or instantiation of a module.

3. The method of claim 1, wherein the changes module comprises a file separate from the netlist.

4. The method of claim 1, wherein the using the changes module to modify at least one of the netlist modules further comprises:
parsing the netlist to create representational netlist comprising an array of objects, each object containing information about an associated element of the netlist;
changing the representational netlist according to the at least one consistent change;
converting the representational netlist into a hardware description language.

5. The method of claim 1, wherein the using the changes module to modify at least one of the netlist modules is performed by a netlist compiler.

6. The method of claim 1, wherein the using the changes module further comprises modifying a port configuration of a wire.

7. The method of claim 1, wherein the using the changes module further comprises modifying a port configuration of a wire at different hierarchical levels of the netlist.

8. The method of claim 1, wherein the changes module contains an instance modifier associated with an instance, the instance modifier indicating a change in the connection of a particular port of the instance.

9. The method of claim 1, wherein the changes module contains an attribute modifier associated with a netlist element, the attribute modifier indicating a change in one or more attributes associated with the netlist element.

10. The method of claim 1, wherein the changes module contains a port modifier associated with a netlist element, the port modifier indicating a change in a port configuration of the netlist element.

11. A method for editing a netlist, the method comprising:
providing a version of the netlist comprising a set of hardware description language netlist modules;
creating a changes module in hardware description language describing at least one consistent change to the netlist modules, the at least one consistent change including a change in a port configuration of a wire in the netlist, the at least one consistent change being applicable to multiple versions of the netlist; and
using the changes module to modify at least one of the netlist modules according to the at least one consistent change to create a modified version of the netlist.

12. The method of claim 11, wherein the using the changes module further comprises modifying the port configuration of the wire.

13. The method of claim 11, wherein the using the changes module further comprises modifying the port configuration of the wire at different hierarchical levels of the netlist.

14. The method of claim 11, wherein the changes module contains a definitional modifier associated with at least one of the netlist modules, the definitional modifier indicating a change in the associated netlist module or instantiation of a module within the associated netlist module.

15. The method of claim 11, wherein the changes module contains an attribute modifier associated with a netlist element, the attribute modifier indicating a change in one or more attributes associated with the netlist element.

16. The method of claim 11, wherein the changes module contains an instance modifier associated with an instance, the instance modifier indicating a change in the connection of a particular port of the instance.

17. A computer-readable medium comprising program instructions which when executed on a computer performs a process for editing a netlist, comprising:
receiving a netlist comprising a set of hardware description language netlist modules;
receiving a changes module in hardware description language describing at least one consistent change to the netlist modules, the at least one consistent change being applicable to multiple versions of the netlist; and;
using the changes module to modify at least one of the netlist modules according to the at least one consistent change to create a modified netlist.

18. The method of claim 1, further comprising:
providing another version of the netlist comprising the set of hardware description language netlist modules; and
using the changes module in hardware description language to modify at least one of the netlist modules in the another version of the netlist according to the at least one consistent change to create another modified version of the netlist.

19. The method of claim 11, further comprising:
providing another version of the netlist comprising the set of hardware description language netlist modules; and
using the changes module in hardware description language to modify at least one of the netlist modules in the another version of the netlist according to the at least one consistent change to create another modified version of the netlist.

* * * * *